United States Patent
Kang et al.

(10) Patent No.: US 9,073,752 B2
(45) Date of Patent: Jul. 7, 2015

(54) QUANTUM DOT LIGHT EMITTING ELEMENT AND METHOD FOR MANUFACTURING THE SAME

(75) Inventors: Ho-Cheol Kang, Gyeonggi-do (KR); Young-Hoon Noh, Gyeonggi-do (KR); Chang-Hee Lee, Seoul (KR); Kook Heon Char, Seoul (KR); Seong-Hoon Lee, Seoul (KR); Jeong Hun Kwak, Seoul (KR); Wan Ki Bae, Seoul (KR); Jae Hoon Lim, Seoul (KR); Dong Gu Lee, Gyeongsangnam-do (KR)

(73) Assignees: LG Display Co., Ltd., Seoul (KR); SNU R&DB FOUNDATION, Seoul (KR)

( * ) Notice: Subject to any disclaimer, the term of this patent is extended or adjusted under 35 U.S.C. 154(b) by 17 days.

(21) Appl. No.: 13/112,128

(22) Filed: May 20, 2011

(65) Prior Publication Data
US 2011/0284819 A1    Nov. 24, 2011

(30) Foreign Application Priority Data
May 20, 2010 (KR) ........................ 10-2010-0047397

(51) Int. Cl.
    *H01L 29/06*     (2006.01)
    *H01L 31/00*     (2006.01)
    (Continued)

(52) U.S. Cl.
    CPC ............... *B82Y 20/00* (2013.01); *H01L 51/502* (2013.01); *H01L 21/02601* (2013.01); *H05B 33/10* (2013.01)

(58) Field of Classification Search
    CPC .................. H01L 31/035218; H01L 21/02601; H01L 51/426; H01L 51/502; H05B 33/10; B82Y 20/00

USPC ........ 257/9, 13, 14, 43, 79, E29.071; 438/22, 438/57, 85, 104
See application file for complete search history.

(56) References Cited

U.S. PATENT DOCUMENTS

| | | | | |
|---|---|---|---|---|
| 5,917,279 A * | 6/1999 | Elschner et al. | ............... | 313/506 |
| 2007/0057263 A1 * | 3/2007 | Kahen | ............................. | 257/79 |

(Continued)

FOREIGN PATENT DOCUMENTS

| | | |
|---|---|---|
| CN | 101263613 A | 9/2008 |
| WO | 2009-084274 A1 | 7/2009 |

OTHER PUBLICATIONS

Qing Shen, Makoto Yanai, Kenji Katayama, Tsuguo Sawada, Taro Toyoda, Optical absorption, photosensitization, and ultrafast carrier dynamic investigations of CdSe quantum dots grafted onto nanostructured SnO2 electrode and fluorine-doped tin oxide (FTO) glass, Chemical Physics Letters, vol. 442, Issues 1-3, Jul. 6, 2007, pp. 89-96, ISSN 0009-2614.*

SIPO—Office Action for Chinese Patent Application 201110133976. 2—Issued on Feb. 2, 2013—Including English Translation.

*Primary Examiner* — Fernando L Toledo
*Assistant Examiner* — Aaron Gray
(74) *Attorney, Agent, or Firm* — Morgan, Lewis & Bockius LLP

(57) ABSTRACT

The present invention relates to a quantum dot light emitting element which can form a quantum light emitting layer configured of charge transporting particles and quantum dots and a charge transporting layer in a solution process, to reduce process expense, and a method for manufacturing the same. The quantum dot light emitting element includes a substrate, an anode formed on the substrate, a quantum light emitting layer formed on the anode, the quantum light emitting layer having charge transporting particles and quantum dots mixed therein, and a cathode formed on the quantum light emitting layer.

10 Claims, 3 Drawing Sheets

(51) Int. Cl.
  *H01L 29/10* (2006.01)
  *H01L 29/12* (2006.01)
  *H01L 21/16* (2006.01)
  *H01L 29/26* (2006.01)
  *H01L 31/12* (2006.01)
  *B82Y 20/00* (2011.01)
  *H01L 51/50* (2006.01)
  *H01L 21/02* (2006.01)
  *H05B 33/10* (2006.01)

(56) References Cited

U.S. PATENT DOCUMENTS

2008/0156371 A1* 7/2008 LoCascio et al. ............. 136/258
2009/0181478 A1* 7/2009 Cox et al. ........................ 438/22
2010/0276731 A1* 11/2010 Nam et al. .................... 257/184
2010/0283045 A1* 11/2010 Uchida ............................ 257/40
2012/0138894 A1* 6/2012 Qian et al. ...................... 257/13

* cited by examiner

QUANTUM DOT LIGHT EMITTING ELEMENT AND METHOD FOR MANUFACTURING THE SAME

CROSS REFERENCE TO RELATED APPLICATION

This application claims the benefit of the Patent Korean Application No. 10-2010-0047397, filed on May 20, 2010, which is hereby incorporated by reference as if fully set forth herein.

BACKGROUND OF THE DISCLOSURE

1. Field of the Disclosure

The present invention relates to a quantum dot light emitting element which can form a quantum light emitting layer configured of charge transporting particles and quantum dots and a charge transporting layer in a solution process, to reduce process expense, and a method for manufacturing the same.

2. Discussion of the Related Art

Quantum dot (QD) is a semiconductor nanoparticle, with the quantum dot of a nanometer size emits a light when an electron of an unstable state is moving downward to a valence band from a conduction band. As a particle of the quantum dot is smaller, a light having a shorter wavelength is generated. As the particle of the quantum is larger, a light having a long wavelength is generated. This is a unique electrical optical characteristic of the quantum dot, different from the other conventional semiconductor elements. Because of that, when the size of the quantum dot is adjusted, a visible ray having a desired wavelength can be presented. Quantum dots having various sizes may be used to present various colors simultaneously.

Compared with an organic light emitting element, a quantum dot light emitting element uses the quantum dot to form a light emitting layer instead of an organic light emitting material. An organic light emitting diode (OLED) using the organic light emitting material presents a single color, for example, white, red and blue based on a type of a diode. The organic light emitting diode has limitation of presenting a variety of colors magnificently. In contrast, the quantum dot light emitting element controls the size of the quantum dot and it can present desired natural colors. In addition, the quantum dot light emitting element has good color presentation and good brightness, compared with a light emitting diode. Because of that, the quantum dot light emitting element is drawing attention to overcome a disadvantage of the light emitting diode spotlighted as next generation light source.

As follows, a structure of a conventional quantum dot light emitting element will be described.

FIG. 1 is a sectional view of a conventional quantum dot light emitting element.

In reference to FIG. 1, the quantum dot light emitting element includes an anode 10 and a cathode 50 opposed to each other on a substrate 100, and a quantum light emitting layer 30 formed between the anode 10 and the cathode 50, with a plurality of quantum dots 31. A hole transporting layer 20 configured of hole transporting particles is formed on the anode 10 and the quantum light emitting layer 30 is formed on the hole transporting layer 20. An electron transporting layer 40 configured of electron transporting particles and the cathode 50 are formed on the quantum light emitting layer 30 sequentially.

The hole transporting layer 20 transports and injects holes to the quantum dots 31 of the quantum light emitting layer 30 from the anode 10. Similarly, electrons injected in the cathode 50 are transported and injected to the quantum dots 31 of the quantum light emitting layer 30 by the electron transporting layer 40.

However, such the conventional quantum dot light emitting element is configured of four or more layers except an electrode and the structure of the conventional quantum dot light emitting element is complex. In addition, most of the layers except the quantum light emitting layer 30 are formed in a vacuum deposition process and a process chamber for the quantum dot light emitting element has to be provided accordingly. As a result, manufacture cost of the quantum dot light emitting element might be increased disadvantageously and process time might be increased.

SUMMARY OF THE DISCLOSURE

Accordingly, the present invention is directed to a quantum dot light emitting element and a method for manufacturing the same.

An object of the present invention is to provide a quantum dot light emitting element which forms a quantum light emitting layer and a charge transporting layer in a solution process which disperses charge transporting particles and quantum dots in a solvent to simplify a structure thereof and to reduce manufacture cost thereof, and a method for manufacturing the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a quantum dot light emitting element includes a substrate; an anode formed on the substrate; a quantum light emitting layer formed on the anode, the quantum light emitting layer having charge transporting particles and quantum dots mixed therein; and a cathode formed on the quantum light emitting layer.

The charge transporting particles may be oxide nanoparticles.

The oxide nanoparticles may have a diameter of 2 nm~20 nm.

The quantum dots may be formed of 2-6 or 3-5 group semiconductor compounds.

The oxide nanoparticles may have a diameter of 2 nm~100 nm.

The oxide nanoparticles may be p-type semiconductor nanoparticles.

The p-type semiconductor nanoparticles may be formed of one selected from nickel oxide ($NiO_x$), vanadium oxide ($VO_x$), molybdenum oxide ($MoO_x$), chrome oxide ($CrO_x$), and barium oxide ($BO_x$).

The quantum dot light emitting element may further include an electrode transporting layer formed on the quantum light emitting layer, the electron transporting layer configured of n-type semiconductor nanoparticles The oxide nanoparticles may be n-type semiconductor nanoparticles.

The n-type semiconductor nanoparticles may be formed of one selected from titanium dioxide ($TiO_2$), zinc oxide (ZnO), indium oxide (InO$_x$), aluminum oxide (AL$_2$O$_3$), zirconium oxide ZrO$_x$, tin oxide (SnO$_x$), and tungsten oxide (WO$_x$).

The quantum dot light emitting element may further include a hole transporting layer formed on the anode, the hole transporting layer configured of p-type semiconductor nanoparticles.

The oxide nanoparticles may include p-type semiconductor nanoparticles, n-type semiconductor nanoparticles.

In another aspect of the present invention, a method for manufacturing a quantum dot light emitting element includes forming an anode on a substrate; forming a quantum light emitting layer having charge transporting particles and quantum dots mixed therein on the anode; and forming a cathode on the quantum light emitting layer.

The charge transporting particles may be oxide nanoparticles.

Forming the quantum light emitting layer may be performed in a solution process which uses liquid having the quantum dots dispersed in a solvent in coating.

The solution process may be performed according to one of inkjet, spin coating, nozzle coating, spray coating and slit coating The solvent may be H$_2$O or an organic solvent.

Therefore, the quantum dot light emitting element according to the present invention has following effects.

First, the quantum light emitting layer is formed of mixture having the charge transporting particles and the quantum dots dispersed in a solvent. The structure of the quantum dot light emitting element is simple, with three layers or less. As a result, a yield may be improved.

Second, the quantum light emitting layer and the charge transporting layer are formed in the solution process. As a result, manufacture cost of the quantum light emitting device may be reduced. Especially, a process line used to manufacture a liquid crystal display device and other flat display devices may be applied to manufacture the quantum dot light emitting element according to the present invention.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

A quantum dot light emitting element according to the present invention includes a substrate, an anode formed on the substrate, a quantum light emitting layer formed on the anode, having charge transporting particles and quantum dots mixed therein, and a cathode formed on the quantum light emitting layer.

Here, the charge transporting particles are selected from oxide nanoparticles and the charge transporting particles are functioned as hole transporting layer or electron transporting layer.

If the charge transporting particles are p-type semiconductor nanoparticles, an electron transporting layer configured of n-type semiconductor nanoparticles may be further formed on the quantum light emitting layer. If they are n-semiconductor nanoparticles, a hole transporting layer configured of p-type semiconductor nanoparticles is further formed.

The charge transporting particles may be p-semiconductor nanoparticles and n-semiconductor nanoparticles.

As follows, the quantum dot light emitting element according to the present invention will be described in detail in reference to the accompanying drawings.

First Embodiment

Figure 1:
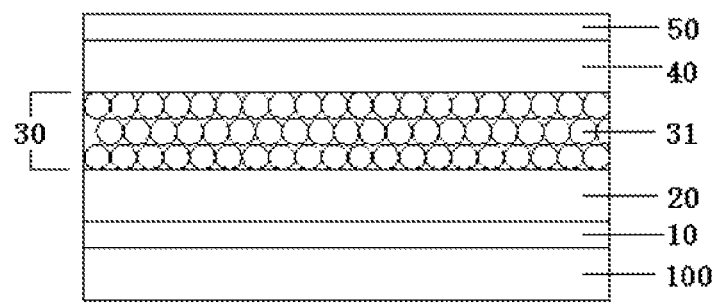
FIG. 1 is a sectional view of a conventional quantum dot light emitting element.
Figure 2:
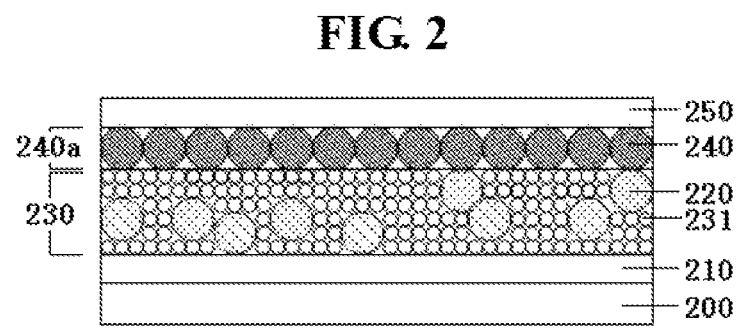
FIG. 2 is a sectional view of a quantum dot light emitting element according to a first embodiment of the present invention.

FIG. 2 is a sectional view of a quantum dot light emitting element according to a first embodiment of the present invention.

In reference to FIG. 2, the quantum dot light emitting element according to the first embodiment of the present invention includes a substrate 200, an anode 210 formed on the substrate 200, a quantum light emitting layer 230 formed on the anode 210, having p-type semiconductor nanoparticles 220 and quantum dots 231 mixed therein, and a cathode 250 formed on the quantum light emitting layer 230.

An electron transporting layer 240a may be further formed between the quantum light emitting layer 230 and the cathode 250.

The substrate 200 may be various types of substrates, not limited specifically, for example, a glass substrate, a plastic substrate and a silicon substrate. The anode 210 is configured of a transparent electrode selected from indium tin oxide, zinc oxide, indium oxide, tin oxide, indium zinc oxide. The cathode 250 is configured of one selected from a group of Ca, Al, Mg, Ag, Ba and alloy of them.

The quantum dot 231 has a diameter of 2 nm~20 nm and it is configured of a core (not shown) and a shell (not shown). A band gap energy of the shell is higher than a band gap energy of the core.

The quantum dot 231 may be selected from a 2-6 group semiconductor compound including CdSe, CdS, CdTe, ZnSe, ZnTe, ZnS and HgTe or a 3-5 group semiconductor compound including InAs and InP.

The p-type semiconductor nanoparticle 220 and the n-type semiconductor nanoparticle 240 has a diameter of 2 nm~100 nm. The p-semiconductor nanoparticle 220 is selected from oxide nanoparticles including nickel oxide (NiO$_x$), vanadium oxide (VO$_x$), molybdenum oxide (MoO$_x$), chrome oxide (CrO$_x$), barium oxide (BO$_x$). The n-semiconductor nanoparticle 240 is selected from oxide nanoparticles including titanium dioxide (TiO$_2$), zinc oxide (ZnO), indium oxide (InO$_x$), aluminum oxide ($AL_2O_3$), zirconium oxide $ZrO_x$, tin oxide ($SnO_x$), and tungsten oxide ($WO_x$).

The p-type semiconductor nanoparticle 220 transports a hole to the quantum dot 231 and the n-type semiconductor nanoparticle 240 transports an electrode to the quantum dot 231.

The quantum light emitting layer 230 is structured to have the p-type semiconductor particles 220 and the n-type semiconductor nanoparticles 240 mixed therein and the electrode transporting layer 240a configured of the n-type semiconductor nanoparticles 240 is formed on the quantum light emitting layer 230.

The quantum dot light emitting element according to the first embodiment forms the quantum light emitting layer having the p-type semiconductor nanoparticles and the quantum dots mixed therein. Compared with the conventional quantum dot light emitting element, the quantum dot light emitting element according to the first embodiment has the simple structure, with less error possibilities. The quantum light emitting layer and the electron transporting layer are formed in a solution process, to reduce manufacture cost.

Second Embodiment

Figure 3:
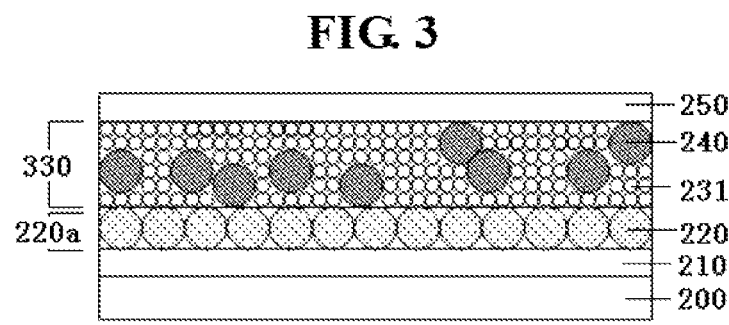
FIG. 3 is a sectional view of a quantum dot light emitting element according to a second embodiment of the present invention.

FIG. 3 is a sectional view of a quantum dot light emitting element according to a second embodiment of the present invention.

At this time, the same numeral references are given to the same components as those of the above embodiment described in reference to FIG. 2 and only different characteristic configuration will be described as follows to avoid repeated description.

In reference to FIG. 3, the quantum dot light emitting element according to the second embodiment of the present invention includes a substrate 200, an anode 210 formed on the substrate 200, a quantum light emitting layer 330 formed on the anode 210, having n-type semiconductor nanoparticles 220 and quantum dots 231 mixed therein, and a cathode 250 formed on the quantum light emitting layer 330.

A hole transporting layer 220a may be further formed between the quantum light emitting layer 330 and the anode 210.

Third Embodiment

Figure 4:
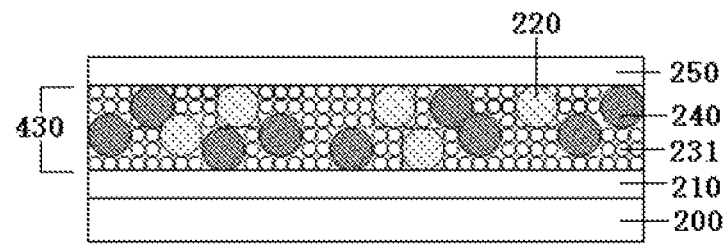
FIG. 4 is a sectional view of a quantum dot light emitting element according to a third embodiment of the present invention.

FIG. 4 is a sectional view of a quantum dot light emitting element according to a third embodiment of the present invention.

At this time, the same numeral references are given to the same components as those of the above embodiment described in reference to FIG. 2 and only different characteristic configuration will be described as follows to avoid repeated description.

In reference to FIG. 4, the quantum dot light emitting element according to the third embodiment of the present invention includes a substrate 200, an anode 210 formed on the substrate 200, a quantum light emitting layer 430 formed on the anode 210, having n-type semiconductor nanoparticles 240, p-type semiconductor nanoparticles 220 and quantum dots 231 mixed therein, and a cathode 250 formed on the quantum light emitting layer 430.

As follows, a method for manufacturing the quantum dot light emitting element according to the embodiments of the present invention will be described.

FIGS. 5a to 5e are process sectional views illustrating a method for manufacturing the quantum dot light emitting element.

Figure 5A:
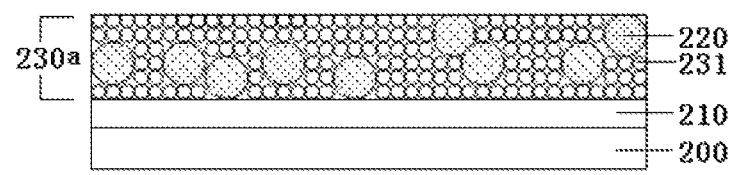
FIGS. 5a to 5e are process sectional views illustrating a method for manufacturing the quantum dot light emitting element according to the embodiments of the present invention.
Figure 5B:
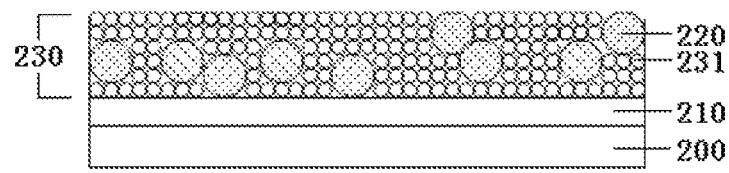

As shown in FIGS. 5a and 5b, the anode is formed on the substrate and the quantum light emitting layer having the charge transporting particles and the quantum dots mixed therein is formed on the anode.

At this time, as shown in FIG. 5a, a quantum light emitting liquid 230a having the charge transporting particles and the quantum dots dispersed in a first solvent (not shown) may be coated on the anode in a solution process. As shown in FIG. 5b, the first solvent is volatilized and the quantum light emitting layer 230 is then formed.

Figure 5C:
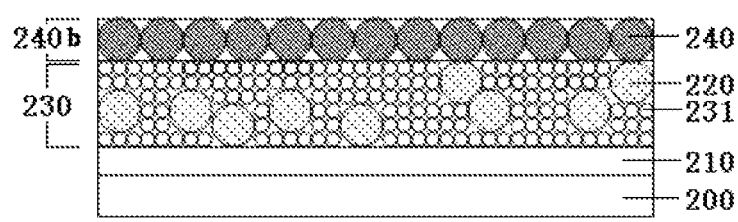

In the meanwhile, the charge transporting particles may be p-type semiconductor nanoparticles or n-type semiconductor nanoparticles. When the charge transporting particles are the p-type semiconductor nanoparticles, electron transporting liquid 240b having the n-type semiconductor nanoparticles dispersed in a second solvent (not shown) is coated on the quantum light emitting layer 230 in a solution process as shown in FIG. 5c.

The solution process may be performed according to one of an inkjet method, a spin coating method, a nozzle coating, a spray coating method and a slit coating method.

Figure 5D:
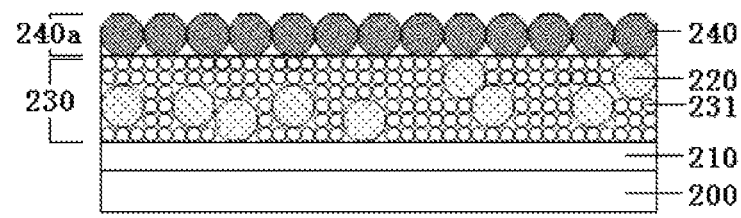
Figure 5E:
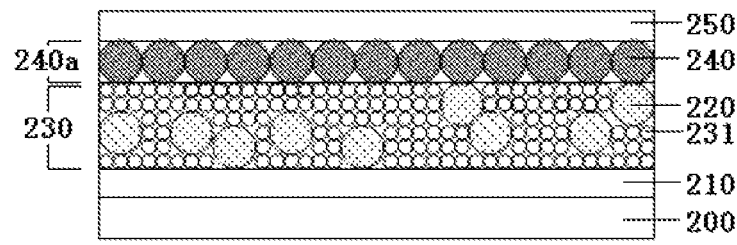

Hence, as shown in FIG. 5d, the second solvent is volatilized and the electrode transporting layer 240a is then formed. As shown in FIG. 5e, the cathode is formed on the electron transporting layer 240a.

The first solvent (not shown) and the second solvent (not shown) may be $H_2O$ or a variety of organic solvents including Hexane, chloroform and toluene. If the first solvent (not shown) is $H_2O$, the second solvent (not shown) is an organic solvent. If the first solvent (not shown) is an organic solvent, the second solvent (not shown) is $H_2O$.

That is, solvents having different characteristics are used to form different layers, respectively, to form multilayered different layers without damage.

The quantum light emitting layer 230 and the electron transporting layer 240a uses different solvents. The n-type semiconductor nanoparticles 240 are dispersed in the solvent, to be coated on the quantum light emitting layer 230. Even after that, there may be no damage to quantum light emitting layer 230.

When the charge transporting particles are n-semiconductor nanoparticles according to the second embodiment of the present invention, the quantum light emitting layer configured of the n-semiconductor nanoparticles and the quantum dots and the hole transporting layer configured of the p-semiconductor nanoparticles are formed in the solution process. Here, the solvent having the n-semiconductor nanoparticles and the quantum dots dispersed therein is different from the solvent having the p-type semiconductor nanoparticles dispersed therein.

The quantum light emitting layer configured of the n-type semiconductor nanoparticles, the p-type semiconductor nanoparticles and the quantum dots according to the third embodiment of the present invention is formed in the solution process. The solvent having the n-semiconductor nanoparticles, the p-type semiconductor nanoparticles and the quantum dots dispersed therein is H2O or a variety of organic solvents including hexane, chloroform and toluene.

As described above, the quantum dot light emitting element according to the present invention mixes the charge transporting particles and the quantum dots and it forms the quantum light emitting layer having them mixed therein, after that. Because of that, the structure of the quantum dot light emitting element may be simple, with three layers or less and a yield may be enhanced accordingly.

Furthermore, the quantum light emitting layer and the electrode transporting layer are formed in the solution process.

Because of that, manufacture cost of the quantum dot light emitting element may be reduced. Especially, a process line used to manufacture a liquid crystal display device and other flat display devices may be applied to manufacture the quantum dot light emitting element according to the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A quantum dot light emitting element, comprising:
    a substrate;
    an anode formed on the substrate;
    a quantum light emitting layer formed on the anode, the quantum light emitting layer comprising charge transporting particles and quantum dots mixed therein; and
    a cathode formed on the quantum light emitting layer,
    wherein the charge transporting particles comprise oxide nanoparticles,
    wherein the oxide nanoparticles comprise p-type semiconductor nanoparticles and n-type semiconductor nanoparticles,
    wherein the p-type and n-type oxide nanoparticles are larger than the quantum dots,
    wherein the p-type semiconductor nanoparticles comprise one of nickel oxide ($NiO_x$), vanadium oxide ($VO_x$), chrome oxide ($CrO_x$), and barium oxide ($BO_x$), and
    wherein the n-type semiconductor nanoparticles comprise one of indium oxide ($InO_x$), aluminum oxide ($AL_2O_3$), zirconium oxide $ZrO_x$, tin oxide ($SnO_x$), and tungsten oxide ($WO_x$).

2. The quantum dot light emitting element of claim 1, wherein the quantum dots have a diameter of 2 nm~20 nm.

3. The quantum dot light emitting element of claim 1, wherein the quantum dots are formed of 2-6 or 3-5 group semiconductor compounds.

4. The quantum dot light emitting element of claim 1, wherein the oxide nanoparticles have a diameter of 2 nm~100 nm.

5. A method for manufacturing a quantum dot light emitting element, the method comprising:
    forming an anode on a substrate;
    forming a quantum light emitting layer comprising charge transporting particles and quantum dots mixed therein on the anode; and
    forming a cathode on the quantum light emitting layer,
    wherein the charge transporting particles comprise oxide nanoparticles,
    wherein the oxide nanoparticles comprise p-type semiconductor nanoparticles and n-type semiconductor nanoparticles,
    wherein the p-type and n-type oxide nanoparticles are larger than the quantum dots,
    wherein the p-type semiconductor nanoparticles comprise one of nickel oxide (NiOx), vanadium oxide ($VO_x$), chrome oxide ($CrO_x$), and barium oxide ($BO_x$), and
    wherein the n-type semiconductor nanoparticles comprise one of indium oxide ($InO_x$), aluminum oxide ($AL_2O_3$), zirconium oxide $ZrO_x$, tin oxide ($SnO_x$), and tungsten oxide ($WO_x$).

6. The method for manufacturing the quantum dot light emitting element of claim 5, wherein forming the quantum light emitting layer is performed in a solution process which uses liquid comprising the quantum dots dispersed in a solvent in coating.

7. The method for manufacturing the quantum dot light emitting element of claim 6, wherein the solution process is performed according to one of inkjet, spin coating, nozzle coating, spray coating, and slit coating.

8. The method for manufacturing the quantum dot light emitting element of claim 6, wherein the solvent is $H_2O$ or an organic solvent.

9. A method for manufacturing a quantum dot light emitting element, the method comprising:
    forming a first electrode on a substrate;
    forming a quantum light emitting layer comprising charge transporting particles and quantum dots mixed therein on the first electrode, the charge transporting particles comprising first oxide nanoparticles, the first oxide nanoparticles comprise one of p-type semiconductor nanoparticles or n-type semiconductor nanoparticles, the forming a quantum light emitting layer comprising:
        providing the mixed charge transporting particles and quantum dots dispersed in a first solvent a solution process; and
        volatizing the first solvent;
    forming a layer of second oxide nanoparticles over the quantum light emitting layer, the second oxide nanoparticles comprising p-type semiconductor nanoparticles or n-type semiconductor nanoparticles other than that of the first oxide nanoparticles, the forming a layer of second oxide nanoparticles comprising:
        providing the second oxide nanoparticles dispersed in a second solvent different from the first solvent; and
        volatizing the second solvent; and
    forming a second electrode on the quantum light emitting layer,
    wherein the p-type and n-type oxide nanoparticles are larger than the quantum dots,
    wherein the p-type semiconductor nanoparticles comprise one of nickel oxide (NiOx), vanadium oxide ($VO_x$), chrome oxide ($CrO_x$), and barium oxide ($BO_x$), and
    wherein the n-type semiconductor nanoparticles comprise one of indium oxide ($InO_x$), aluminum oxide ($AL_2O_3$), zirconium oxide $ZrO_x$, tin oxide ($SnO_x$), and tungsten oxide ($WO_x$).

10. The method of claim 9, wherein each of the first and second solvents comprises one of: $H_2O$ and an organic solvent.

* * * * *